(12) United States Patent  
Park et al.

(10) Patent No.: US 7,592,865 B2
(45) Date of Patent: Sep. 22, 2009

(54) POWER AMPLIFIER USING POWER COMBINER

(75) Inventors: Changkun Park, Gyeongsangnam-do (KR); Songcheol Hong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 119 days.

(21) Appl. No.: 11/976,030

(22) Filed: Oct. 19, 2007

(65) Prior Publication Data

US 2009/0009241 A1  Jan. 8, 2009

(30) Foreign Application Priority Data

Nov. 21, 2006  (KR) .................. 10-2006-0115133

(51) Int. Cl.
*H03F 3/68* (2006.01)
(52) U.S. Cl. .................................. 330/124 R; 330/195

(58) Field of Classification Search ............. 330/124 R, 330/295, 301, 195; 333/26, 125
See application file for complete search history.

(56) References Cited

U.S. PATENT DOCUMENTS

| | | | |
|---|---|---|---|
| 5,121,090 A * | 6/1992 | Garuts et al. ................. 333/124 |
| 6,262,629 B1 | 7/2001 | Stengel et al. | |
| 7,109,897 B1 | 9/2006 | Levesque | |
| 7,242,245 B2 * | 7/2007 | Burns et al. ............. 330/124 R |
| 2008/0204134 A1 * | 8/2008 | Knickerbocker et al. 330/124 R |

* cited by examiner

*Primary Examiner*—Steven J Mottola
(74) *Attorney, Agent, or Firm*—Oliff & Berridge, PLC

(57) ABSTRACT

Disclosed herein is a power amplifier using a power combiner, which is capable of minimizing power loss and improving efficiency of the power amplifier with a large output power, by combining powers generated by a plurality of power amplifiers used in a wireless communication system using a transmission line transformer.

12 Claims, 12 Drawing Sheets

(A)

(B)

(A)

(B)

0
POWER AMPLIFIER USING POWER COMBINER

BACKGROUND OF THE INVENTION

1. Field of the Invention

The present invention relates to a power amplifier using a power combiner, and more particularly to a power amplifier using a power combiner, which is capable of minimizing power loss and improving efficiency of the power amplifier with a large output power, by combining powers generated by a plurality of power amplifiers used in a wireless communication system using a transmission line transformer.

2. Description of the Related Art

A power combiner and a power amplifier are used for allowing a transmitter of a wireless communication system to transmit a radio frequency signal with a large output power.

FIG. 1 is a view showing the configuration of a general power amplifier.

As shown in FIG. 1, the power amplifier includes an amplifier unit including a power transistor 101 and a matching circuit 102 for converting a value of a load resistor connected to an output port 103 into a value of a load resistor for allowing the power transistor 101 to generate a large power.

In general, in a wireless communication system, the value of the load resistor connected to the output port 103 is 50Ω, but a value Rload_optimum is not 50Ω. Accordingly, the matching circuit 102 is required.

In order to obtain an output power larger than that of the power amplifier shown in FIG. 1, an amplifier unit larger than the power transistor 101 is required.

FIG. 2 is a view showing the structure of a general amplifier for generating a large output power using several amplifiers.

In FIG. 2, an amplifier unit 201 includes several power transistors 101 so as to generate an output power larger than that of the power transistor 101.

As shown in FIG. 2, in the general power amplifier, the output powers generated by the amplifier unit 201 are combined by a power combiner and a matching circuit 202. At this time, the powers should be combined by the matching circuit 202 such that power loss is minimized.

In general, the matching circuit 202 includes a combination of passive elements such as an inductor or a capacitor.

However, since such passive elements formed on a silicon substrate having an integrated CMOS have a large parasitic resistance component, large power loss is generated in the power combiner and the matching circuit 202.

If a power amplifier for generating an output power of several Watts is formed on the silicon substrate in a current technological level, the power loss generated in the power combiner and the matching circuit reaches 50% of the power generated in the power transistor.

Accordingly, in the current technological level, a power amplifier obtained by integrating all passive elements on a silicon substrate is negligibly commercialized.

In order to overcome such a problem, in most of current power amplifiers, passive elements are made of a compound semiconductor having a small parasitic resistance component or are implemented on an off-chip without being integrated. However, such a method increases manufacturing cost of a power amplifier.

SUMMARY OF THE INVENTION

Therefore, the present invention has been made in view of the above problems, and it is an object of the present invention to provide a power amplifier using a power combiner, which is capable of minimizing power loss and improving efficiency of the power amplifier with a large output power, by combining powers generated by a plurality of power amplifiers used in a wireless communication system using a transmission line transformer.

In accordance with the present invention, the above and other objects can be accomplished by the provision of a power amplifier using a power combiner, wherein first and second amplifier units amplify and output radio frequency signals having opposite phases and are respectively connected to one ends of a first transmission line and a second transmission line of a first transmission line transformer, third and fourth amplifier units amplify and output radio frequency signals having opposite phases and are respectively connected to one ends of a third transmission line and a fourth transmission line of a second transmission line transformer, the other ends of the second transmission line of the first transmission line transformer and the third transmission line of the second transmission line transformer are connected to each other so as to be connected to ground, the other end of the first transmission line of the first transmission line transformer is connected to one end of a fifth transmission line of a third transmission line transformer, the other end of the fourth transmission line of the second transmission line transformer is connected to one end of a sixth transmission line of the third transmission line transformer, the fifth transmission line of the third transmission line transformer is connected to ground via an output resistor, and the sixth transmission line of the third transmission line transformer is connected to ground.

Preferably, the power amplifier may be combined in plural, and the third transmission line transformers of the power amplifiers may be commonly connected to the output resistor and ground.

Preferably, the power amplifier may be combined in plural, a fourth transmission line transformer may be interposed between the output resistor and ground, different outputs of the third transmission line transformers of the power amplifiers may be connected to each other, and the other different outputs of the third transmission line transformers may be respectively connected to a seventh transmission line and an eighth transmission line of the fourth transmission line transformer.

Preferably, the transmission line transformers of the power amplifier according to the present invention may be replaced with spiral transformers.

According to another aspect of the present invention, there is provided a power amplifier using a power combiner, wherein first and second amplifier units amplify and output radio frequency signals having opposite phases, the first amplifier unit is connected to one ends of first and third transmission lines of first and second transmission line transformers, the second amplifier unit is connected to one ends of second and fourth transmission lines of the first and second transmission line transformers; the other end of the second transmission line of the first transmission line transformer and the other end of the third transmission line of the second transmission line transformer are connected to each other so as to be connected to ground, the other end of the first transmission line of the first transmission line transformer is connected to one end of a fifth transmission line of a third transmission line transformer, the other end of the fourth transmission line of the second transmission line transformer is connected to one side of a sixth transmission line of the third transmission line transformer, the fifth transmission line of the third transmission line transformer is connected to ground via an output resistor, and the sixth transmission line of the third transmission line transformer is connected to ground.

Preferably, the power amplifier may be combined in plural, and the third transmission line transformers of the power amplifiers may be commonly connected to the output resistor and ground.

Preferably, the power amplifier may be combined in plural, a fourth transmission line transformer may be interposed between the output resistor and ground, different outputs of the third transmission line transformers of the power amplifiers may be connected to each other, and the other different outputs of the third transmission line transformers may be respectively connected to a seventh transmission line and an eighth transmission line of the fourth transmission line transformer.

Preferably the transmission line transformers of the power amplifier according to the present invention may be replaced with spiral transformers.

According to the present invention, it is possible to minimize power loss and to improve efficiency of a power amplifier with a large output power, by combining powers generated by power amplifiers using a transmission line transformer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
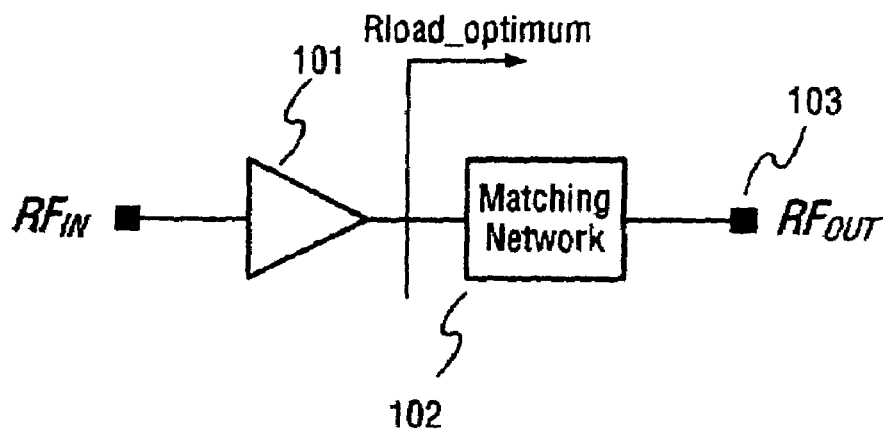
FIG. 1 is a view showing the configuration of a general power amplifier.
Figure 2:
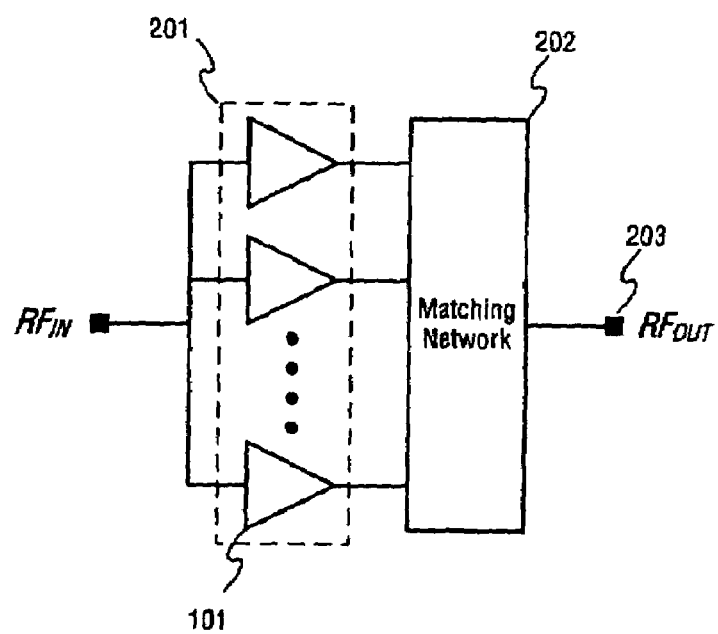
FIG. 2 is a view showing the configuration of a general amplifier for generating a large output power using several amplifier units.
Figure 3:
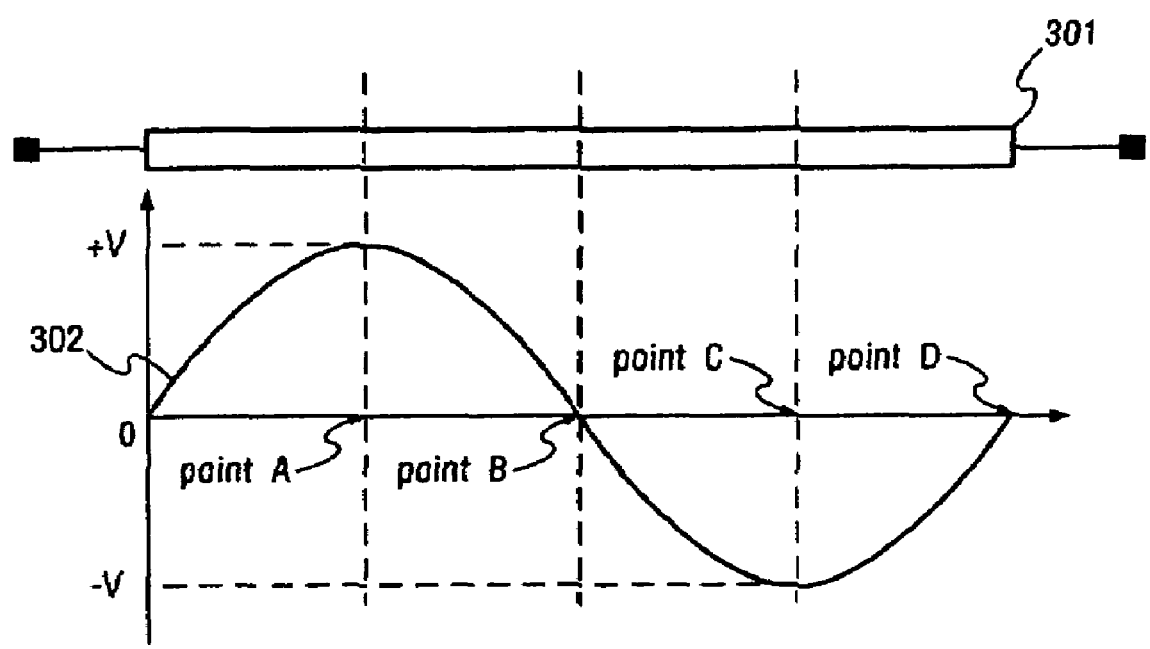
FIG. 3 is a view showing a transmission line, which is a basic component of a power combiner according to the present invention, and the waveform of a signal flowing in the transmission line.

FIG. 3 is a view showing a transmission line, which is a basic component of a power combiner according to the present invention, and the waveform of a signal flowing in the transmission line.

A reference numeral 302 denotes the waveform of an AC signal transmitted through a line 301.

As shown in FIG. 3, a voltage of a point A is 0 V, a voltage of a point B is 1 V, and a voltage of a point D is −1 V. In general, since an AC signal of several MHz has a large wavelength, a very long line is necessary for obtaining the characteristics shown in FIG. 3. In contrast, since an AC signal of several GHz has a small wavelength, the characteristics shown in FIG. 3 are obtained by only a line having a length of several mm or several hundreds of μm.

The transmission line 301 having the characteristics shown in FIG. 3 has power loss lower than that of a passive element such as a spiral inductor.

Accordingly, since the power combiner according to the present invention includes the transmission line as a basic component, the power loss of the power combiner is significantly lower than that of the general matching circuit.

Figure 4:
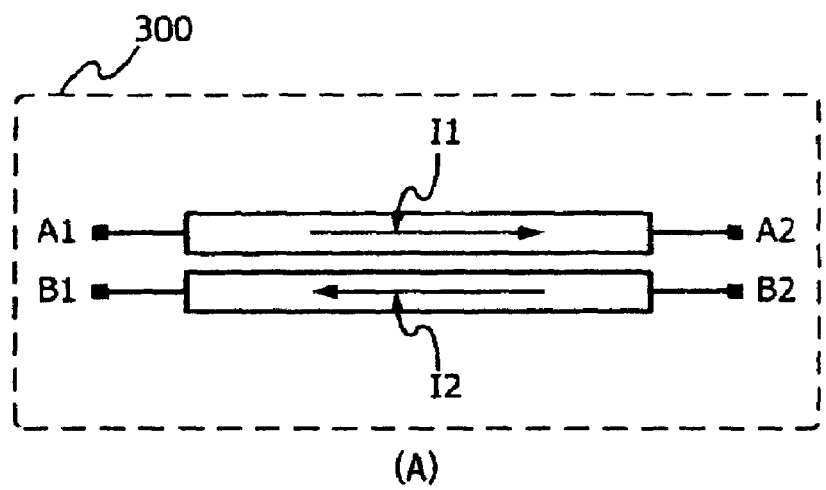
FIG. 4 is a circuit diagram showing a general transmission line transformer used in the power combiner according to the present invention.
Figure 4:
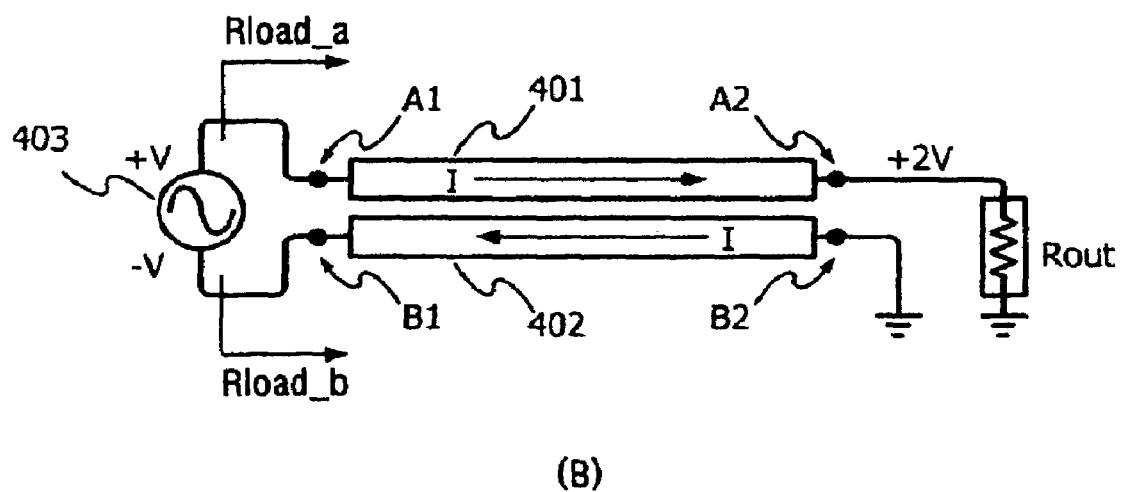

FIG. 4 is a circuit diagram showing a general transmission line transformer used in the power combiner according to the present invention.

Here, signs "+" and "−" indicate that the phases of the AC signals are opposed to each other.

As shown in FIG. 4A, a transmission line transformer 300 includes transmission lines 401 and 402 which are adjacent to each other such that currents flowing in the transmission lines 401 and 402 are respectively influenced by respective magnetic fields generated by the transmission lines 402 and 401.

At this time, the transmission line indicates a line for transmitting a radio frequency signal. Hereinafter, an operation principle of the transformer 300 using the transmission lines 401 and 402 will be described.

If current I1 flows in the transmission line 401, a magnetic field is generated by the current I1 in the vicinity of the transmission line 401. At this time, current I2 is generated in the transmission line 402 so as to suppress a variation in magnetic field generated by the current I1. If a voltage of a point A1 is VA1, a voltage of a point VA2 is VA2, a voltage of a point B1 is VB1, and a voltage of a point VB2 is VB2, the voltages satisfy Equation 1

$$V_{A1} - V_{B1} = V_{A2} - V_{B2} \qquad \text{Equation 1}$$

On the basis of the basic principle of the transmission line transformer 300, the circuit diagram of FIG. 4B is analyzed as follows.

Since the points VA1 and VB1 may have voltages +V and −V by a AC voltage source 403, the currents flowing in the transmission lines 401 and 402 have characteristics that the levels of the currents are equal and the directions thereof are opposed to each other by the basic principle of the transmission line transformer 300. Since VA1=+V, VB1=−V and VB2=0, it can be seen that the voltage VB2 is 2 V by Equation 1.

At this time, in the computation of the power generated by the AC voltage source 403, the power is obtained by multiplying current by a voltage. In a case of an AC signal, the power is obtained by multiplying a product of current and voltage by 0.5. Accordingly, the power of the point A1 is 0.5×I×V and the power of the point B1 is 0.5×I×V. Thus, it can be seen that the AC voltage source 403 generates the power of 0.5×I×V+0.5×I×V=I×V. Since the current of the point A2 is I and the voltage thereof is 2 V, it can be seen that the power delivered to a resistor Rout becomes 0.5×2I×V=I×V and the whole power generated by the AC voltage source 403 is delivered to a resistor Rload. At this time, Rout=2V/I, Rload_a=V/I and Rload_b=V/I are obtained by Ohm's law.

Accordingly, since a relationship of 2Rload_a=2Rload_b=Rout is obtained, it can be seen that impedance can be changed by the transmission lines 401 and 402. Thus, the voltages of the points A1 and B1 swing between the voltages +V and −V, it can be seen that the voltage of the point A2 swings between the voltages +2V and −2V and thus the voltage, which is one of the characteristics of the general transformer, can be changed.

A transformer using a transmission line is called a transmission line transformer. In the present invention, the transmission line transformer is formed as a basic component.

Figure 5:
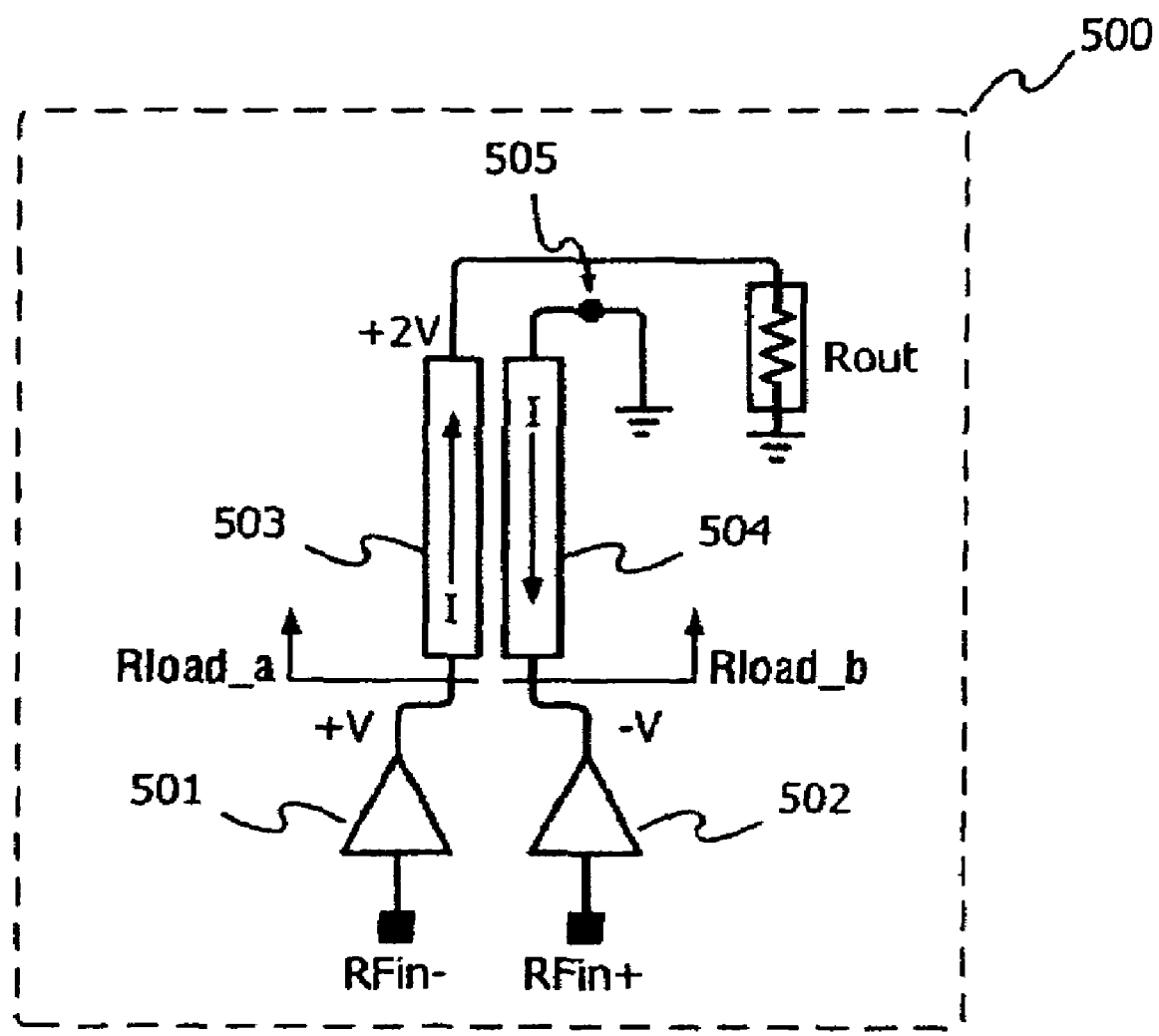
FIG. 5 is a circuit diagram showing the basic structure of the power combiner using the transmission line transformer, according to the present invention.

FIG. 5 is a circuit diagram showing the basic structure of the power combiner using the transmission line transformer, according to the present invention.

As shown in FIG. 5, if signals RFin having opposite phases are respectively applied to amplifier units 501 and 502 each composed of a power transistor, the power transistors 501 and 502 respectively generate output signals −V and +V having opposite phases. Since the AC voltage source 403 shown in FIG. 4B is replaced with the power transistors 501 and 502, FIGS. 4B and 5 show the same circuit.

At this time, if the value of the resistor Rout is 50Ω, both the values of resistors Rload_a and Rload_b become 25Ω. Accordingly, an impedance change ratio R is 2. Since the values of the resistors Rload_a and Rload_b are always equal to each other, only the value of the resistor Rload is described. Since the value of the load resistor of the amplifier having 50Ω is changed to the value of the resistor Rload, the transmission line transformer using the transmission lines 503 and 504 functions as a matching circuit.

Accordingly, the output of the power combiner 500 has the characteristics expressed by Equation 2.

$$P_{OUT} \propto N \cdot \frac{V_{DD}^2}{R_{load}} = N \cdot R \cdot \frac{V_{DD}^2}{R_{out}} \qquad \text{Equation 2}$$

Pout: output power
N: number of amplifier units
$V_{DD}$: power supply voltage of the amplifier units
Rload: load resistor of the amplifier units
R: impedance change ratio In order to easily compare the output powers of the power combiner 500, it can be theoretically seen from Equation 2 that, as a product N×R is increased, the output power is increased. Accordingly, when N=2 and R=2, N×R becomes 4.

Figure 6:
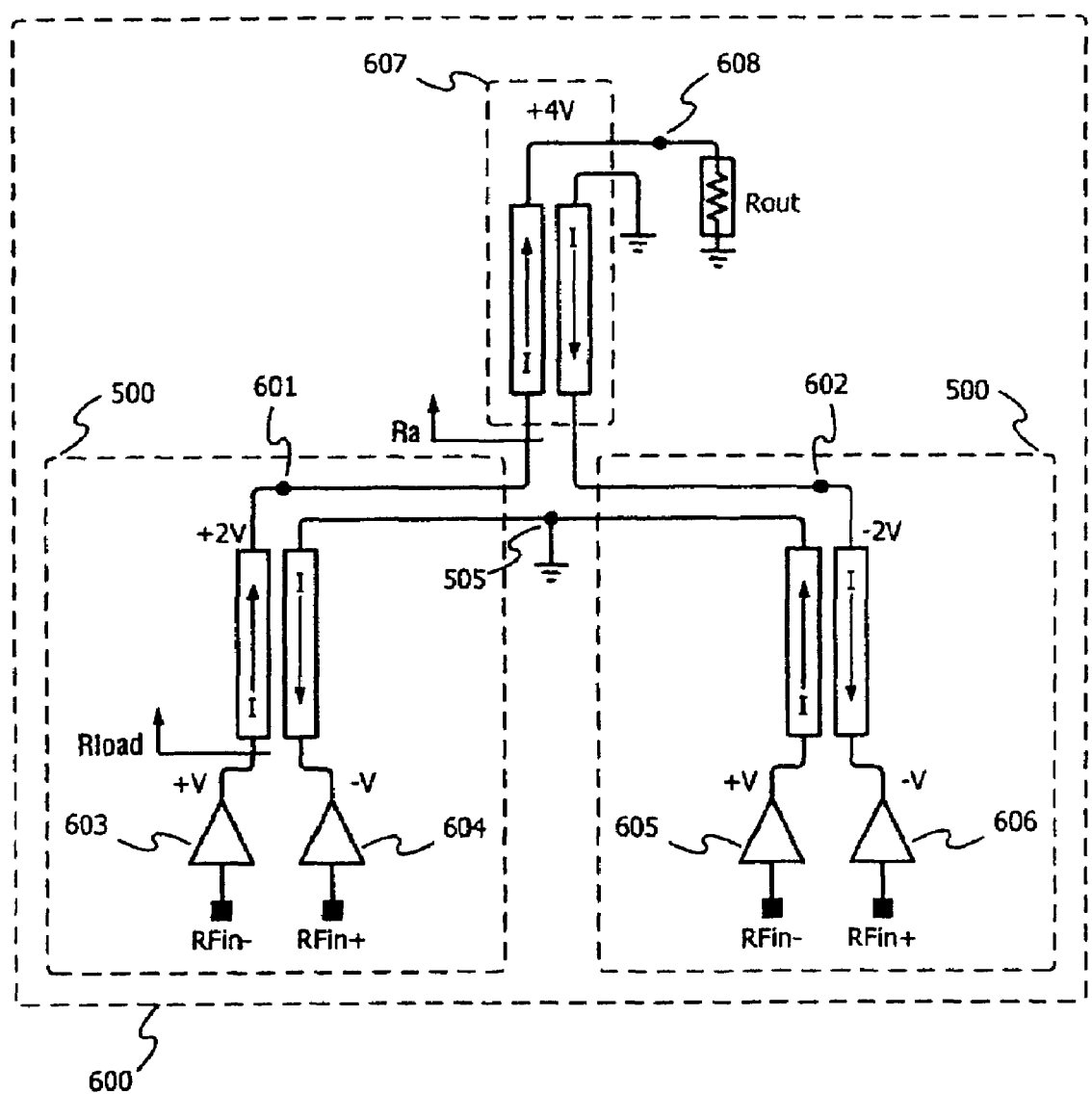
FIG. 6 is a circuit diagram showing a power amplifier using a power combiner according to a first embodiment of the present invention.

FIG. 6 is a circuit diagram showing a power amplifier using a power combiner according to a first embodiment of the present invention.

As shown in FIG. 6, a power amplifier 600 for combining the output powers of the power combiners 500 includes two power combiners 500 shown in FIG. 5.

That is, the power combiners 500 are commonly connected to ground 505. At this time, ground 505 is AC virtual ground by the principle of a differential amplifier. Accordingly, although a power supply voltage which has the same effect as an AC ground voltage is applied to ground 505, an AC operation of the circuit is not influenced. Accordingly, ground 505 can be used as an input unit of the power supply voltage of the power amplifier.

If the phases of signals RFin of amplifier units 603, 604, 605 and 606 of the power combiners 500 are respectively "−", "+", "−" and "+", the voltages of output units 601 and 602 respectively become +2 V and −2V. The voltages and the currents of the output units 601 and 602 are input to a transmission line transformer 607 and an output port 608 outputs a voltage of +4 V.

At this time, if the levels of the currents flowing in the amplifier units 603, 604, 605 and 606 are 1I, the levels of the currents flowing in the output units 601 and 602 becomes 1I and the level of the current flowing in the transmission line transformer 607 also becomes 1I. Accordingly, Equation 3 is obtained by Ohm's law.

$$4V/I=Rout, \ 2V/I=Ra, \ V/I=Rload \qquad \text{Equation 3}$$

Accordingly, a relationship of Rout:Ra:Rload=4:2:1 is obtained.

In general, a load resistor connected between an input and an output of a radio frequency circuit is 50Ω. Accordingly, if the value of the resistor Rout is 50Ω, the values of the resistors Ra and Rload respectively become 25Ω and 12.5Ω. In addition, since N=4 and R=4, N×R becomes 16.

Figure 7:
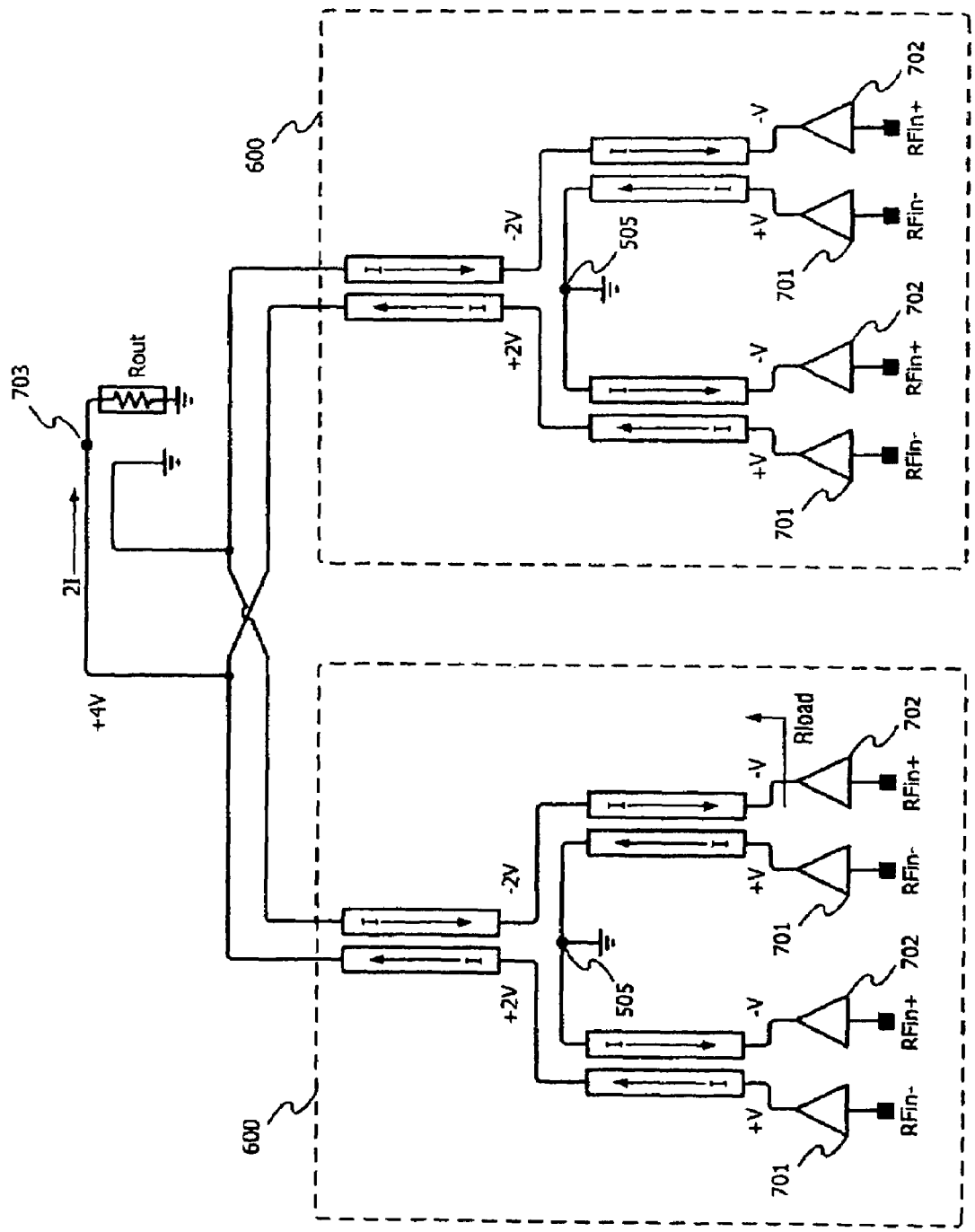
FIG. 7 is a circuit diagram showing a power amplifier using a power combiner according to a second embodiment of the present invention.

FIG. 7 is a circuit diagram showing a power amplifier using a power combiner according to a second embodiment of the present invention.

As shown in FIG. 7, the power amplifier according to the second embodiment includes two power amplifiers 600 shown in FIG. 6.

Accordingly, ground portions of the two power amplifiers 600 are connected to each other to be commonly connected to ground and the output ports thereof are connected to each other to be connected to the resistor Rout.

At this time, ground 505 is AC virtual ground and can be used as an input unit of a power supply voltage of the amplifier.

If the phases of the signals RFin of amplifier units 701 and 702 of the power amplifier are respectively "−" and "+", the output voltages of the amplifier units 701 and 702 respectively become +V and −V, the current flowing into the resistor Rout becomes 2I, and the voltage across the resistor Rout becomes 4 V. In this case, the values of the resistors Rload and Rout are computed by Equation 4.

$$4V/2I=Rout, \ V/I=Rload \qquad \text{Equation 4}$$

Accordingly, a relationship of Rout:Rload=2:1 is obtained.

In this case, since N=8 and R=2, N×R becomes 16 and the same output power as FIG. 6 can be obtained.

Figure 8:
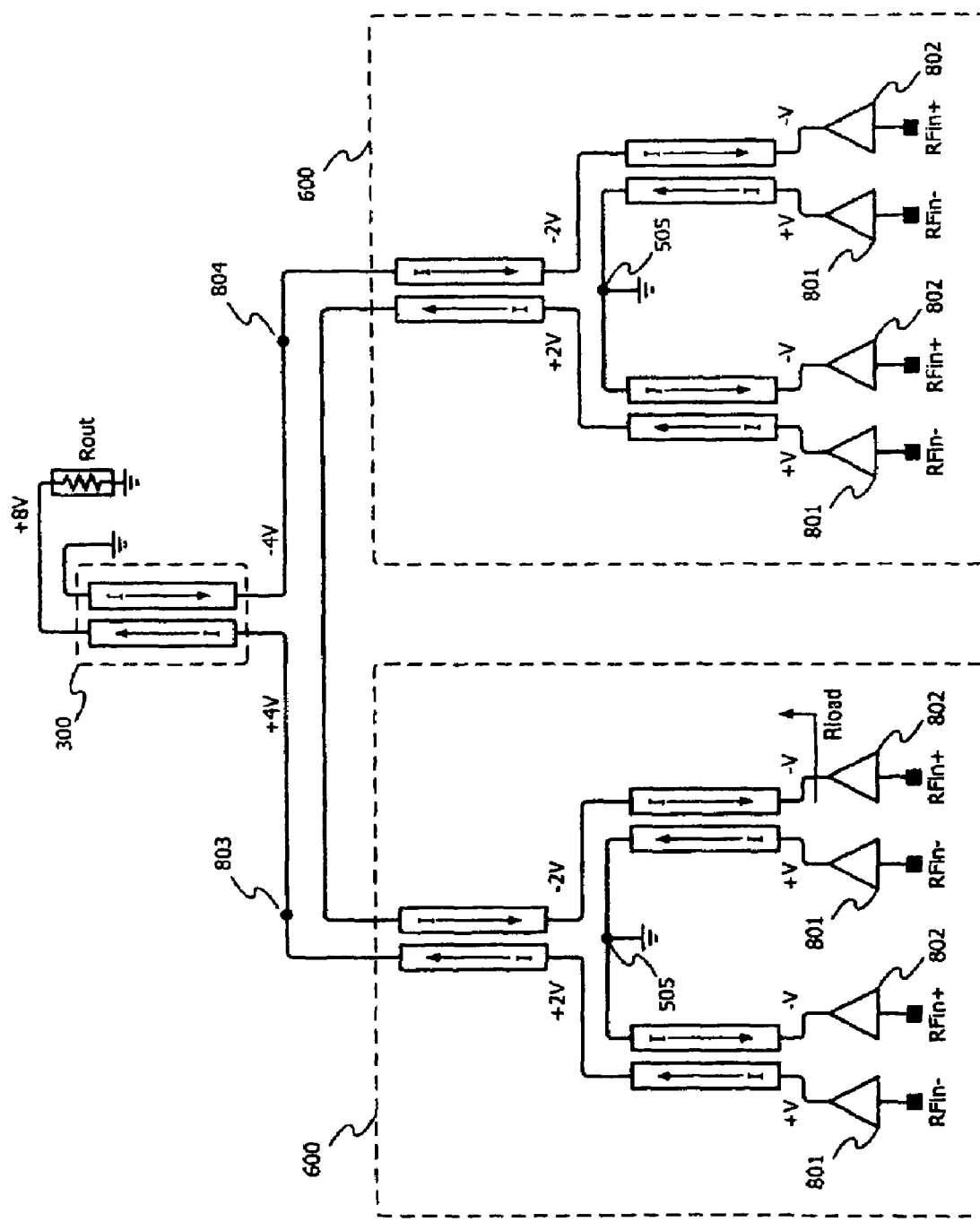
FIG. 8 is a circuit diagram showing a power amplifier using a power combiner according to a third embodiment of the present invention.

FIG. 8 is a circuit diagram showing a power amplifier using a power combiner according to a third embodiment of the present invention.

As shown in FIG. 8, in order to obtain a larger output power, the power amplifier according to the third embodiment includes a transmission line transformer 300 for combining the output powers of the power amplifiers 600, in addition to two power amplifiers 600 shown in FIG. 6.

That is, the ground portion and the output port of one side of each of the two power amplifiers 600 are connected to each other and the output port and the ground portion of the other side thereof are respectively connected to the ground portion and the resistor Rout of the transmission line transformer 300.

At this time, if the phases of the signals RFin of amplifier units 801 and 802 are respectively "−" and "+", the output voltages of the amplifier units 801 and 802 respectively become +V and −V, the voltages of the output ports 803 and 804 of the power amplifiers 600 respectively +4 V and −4 V, and the current becomes I. According to the principle described in FIG. 3, the voltage across the resistor Rout becomes +8 V and current flowing therein becomes I.

If the above-described method is used, N becomes 8, R becomes 8, and thus N×R becomes 64.

AC virtual ground 505 is formed and can be used as an input unit of a power supply voltage of the amplifier.

Accordingly, since the output powers are combined by the power combiner using the transmission line transformer according to the present invention, it is possible to obtain a larger output power.

Figure 9:
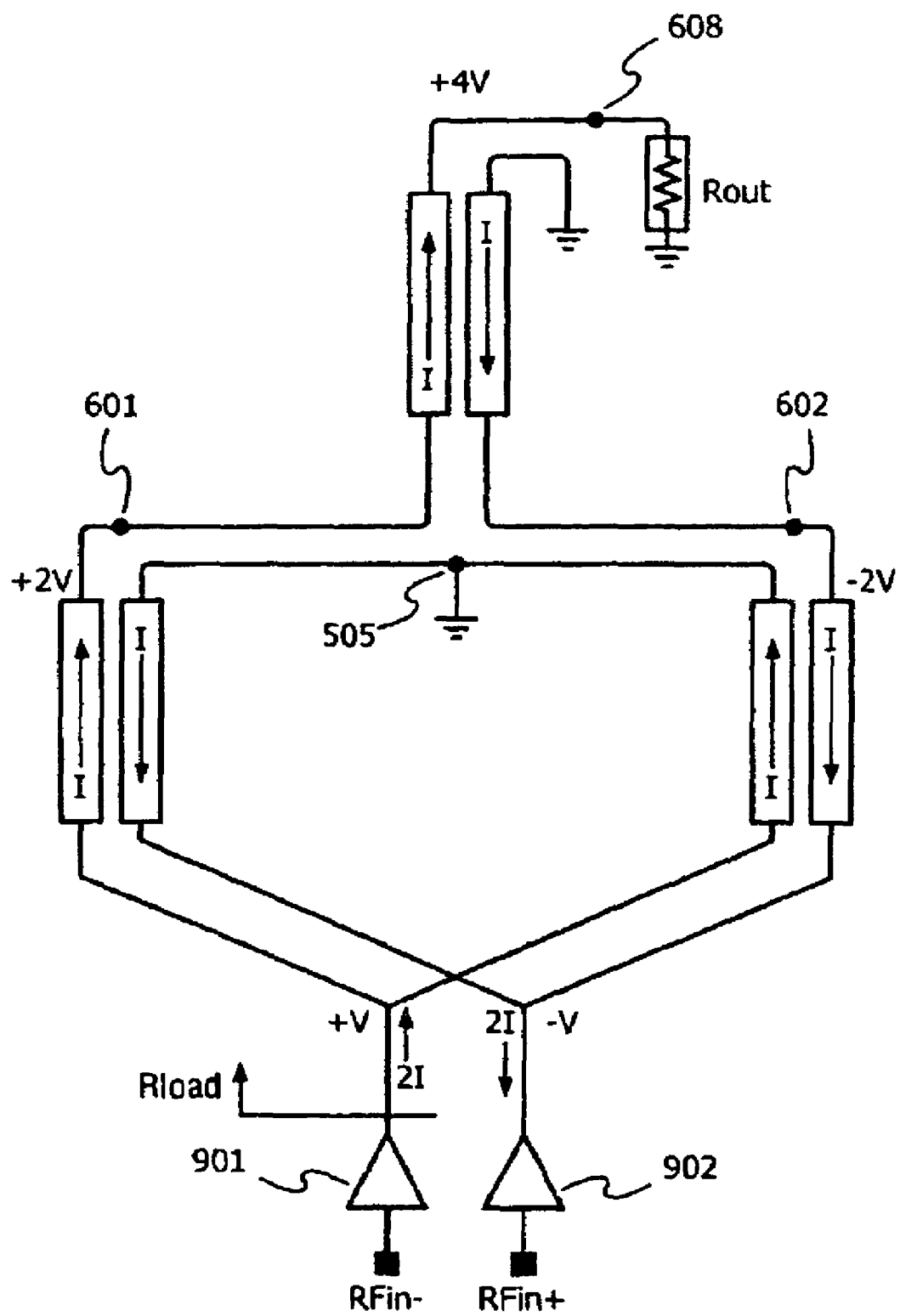
FIG. 9 is a circuit diagram showing a power amplifier using a power combiner according to a fourth embodiment of the present invention.

FIG. 9 is a circuit diagram showing a power amplifier using a power combiner according to a fourth embodiment of the present invention.

The power amplifier shown in FIG. 9 is a modified example of the power combiner configuring the power amplifier shown in FIG. 6. The output port of one of amplifier units 901 and 902 each composed of a power transistor is connected to one transmission line of each of two transmission line transformers and the output port of the other one of the amplifier units 901 and 902 is connected to the other transmission line of each of the two transmission line transformers such that the output signals of the amplifier units 901 and 902 are distributed to the two transmission line transformers. A second output port of one of the two transmission line transformers and a first output port of the other one thereof are connected to each other, and a first output port 601 of one of the two transmission line transformers and a second output port 602 of the other one thereof are respectively connected to transmission lines of another transmission line transformer so as to be respectively connected to ground and a load.

At this time, if the phases of the input signals RFin of the amplifier units 901 and 902 are opposed to each other, the phases of the output signals of the amplifier units 901 and 902 are opposed to each other. If the output voltages of the amplifier units 901 and 902 are respectively +V and −V and the levels of the currents flowing therein are 2I, the levels of the currents flowing in the transmission lines become I, the level of current flowing into the resistor Rout becomes I, and the voltage across the resistor Rout becomes +4 V.

In this case, Equation 5 is used for obtaining the impedance change ratio R.

$$4V/I = R\text{out}, V/2I = R\text{load}.\qquad\text{Equation 5}$$

Accordingly, a relationship of Rout:Rload=8:1 is obtained.

In Equation 5, if the impedance change ratio R is 8Ω and the value of the resistor Rout is 50Ω, the value of the resistor Rload becomes 6.25. The number N of amplifier units becomes 2. Accordingly, N×R becomes 16.

Figure 10:
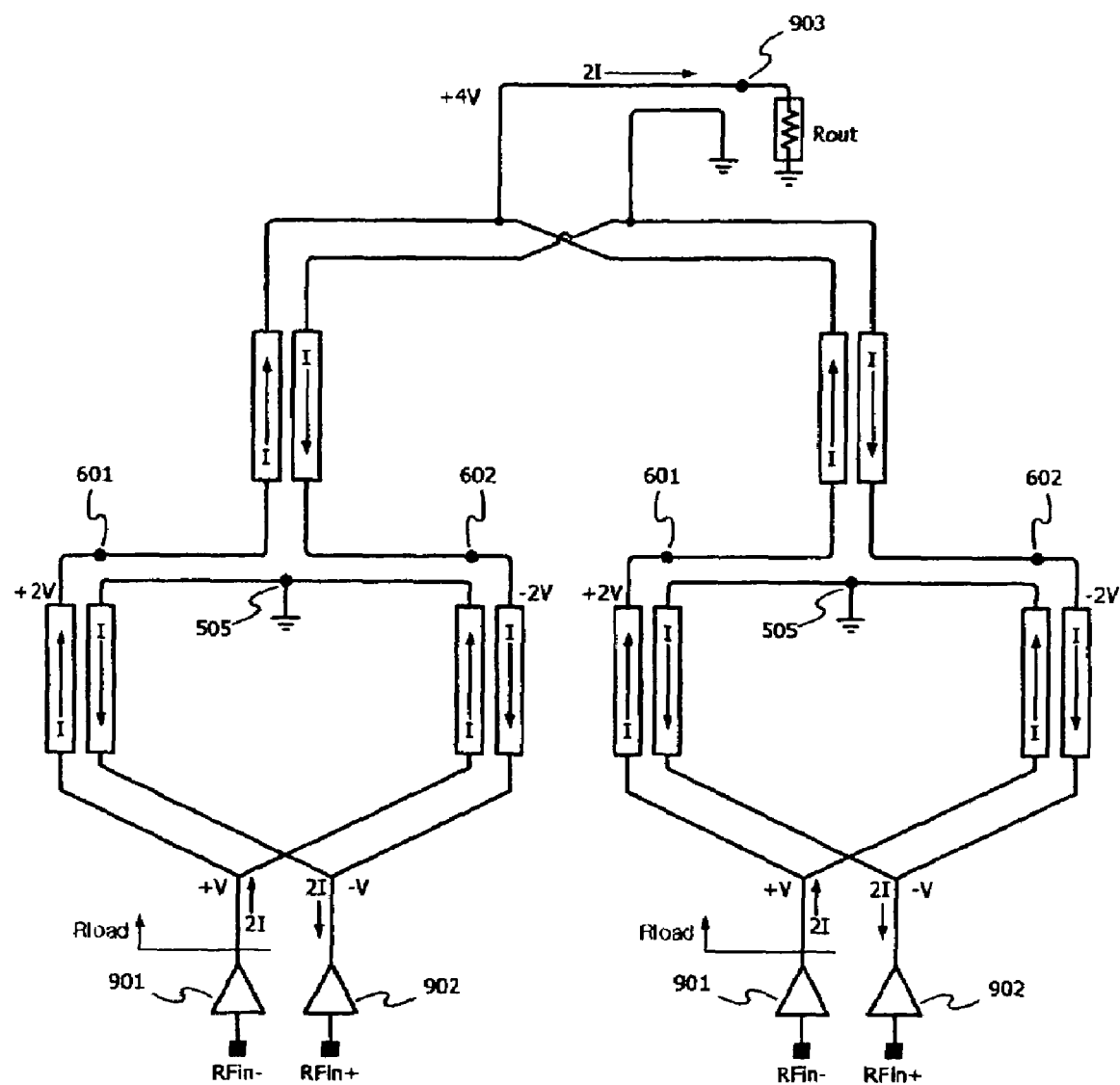
FIG. 10 is a circuit diagram showing a power amplifier using a power combiner according to a fifth embodiment of the present invention.

FIG. 10 is a circuit diagram showing a power amplifier using a power combiner according to a fifth embodiment of the present invention.

The power amplifier shown in FIG. 10 has the structure obtained by replacing the power amplifier shown in FIG. 7 with the power amplifier shown in FIG. 9.

At this time, in consideration of the currents flowing in and the voltages across the transmission lines and the resistor Rout, Equation 6 is used for obtaining N and R.

$$4V/2I = R\text{out}, V/2I = R\text{load}\qquad\text{Equation 6}$$

Accordingly, a relationship of Rout:Rload=4:1 is obtained.

In Equation 6, R is 4 and the number N of amplifier units is 4. Accordingly, N×R becomes 16.

In the power combiners shown in FIGS. 9 and 10, AC virtual ground 505 is formed and can be used as an input unit of a power supply voltage of the amplifier.

The power amplifier shown in FIG. 8 may be replaced with the power amplifier shown in FIG. 9.

Figure 11:
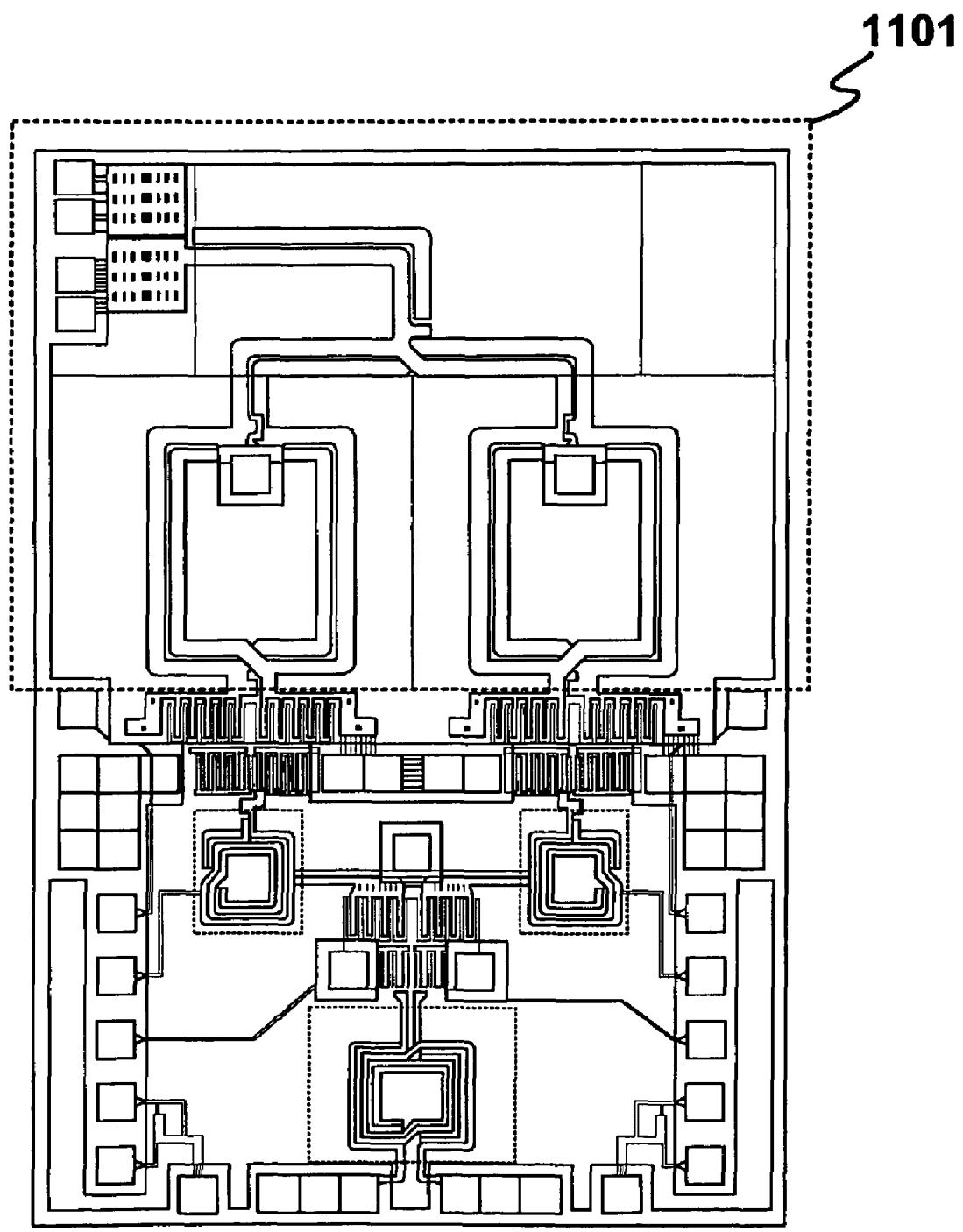
FIG. 11 is a picture showing an actual layout of an integrated circuit including the power amplifier shown in FIG. 10.

FIG. 11 is a picture showing an actual layout of an integrated circuit including the power amplifier shown in FIG. 10 using RFCMOS 0.18 μm process.

A reference numeral 1101 indicates the power combiner according to the present invention. At this time, the transmission line configuring the power combiner is made of aluminum, the thickness thereof is about 2.5 μm, and the width thereof is 20 μm.

Figure 12:
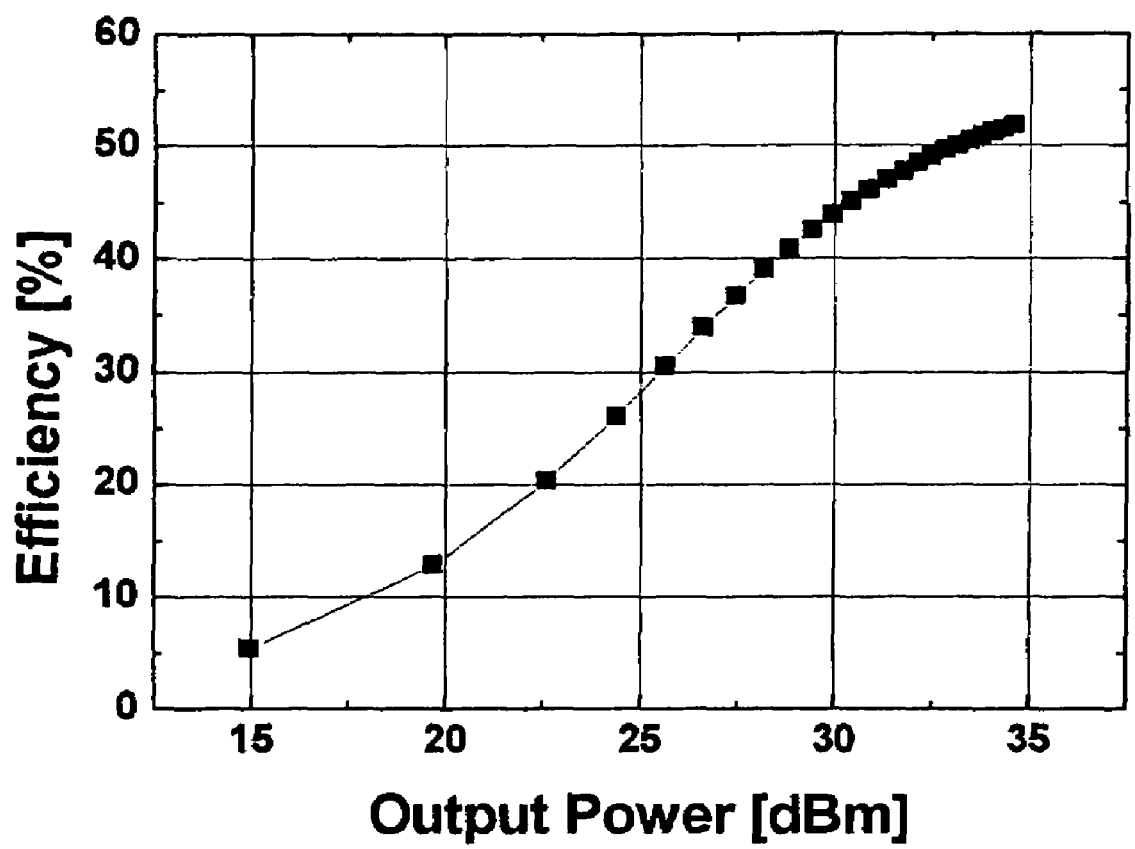
FIG. 12 is a graph showing a computer simulation result of the power amplifier shown in FIG. 11.

FIG. 12 is a graph showing a computer simulation result of the power amplifier shown in FIG. 11.

In a computer simulation result, the efficiency and the output power are examined in the condition that the operation frequency of the circuit is 1.8 GHz, the input power is fixed to a constant value, and the level of the power supply voltage of the circuit varies from 0.5 V to 3.3 V. As shown in FIG. 12, a maximum output power is about 34.5 dBm and, at this time, the efficiency is 48%. As a result, the efficiency of the amplifier having a watt-class output power at the operation frequency of 1.8 GHz is very high.

The power amplifier according to the present invention can efficiently combine the output powers generated by the amplifier units.

Figure 13:
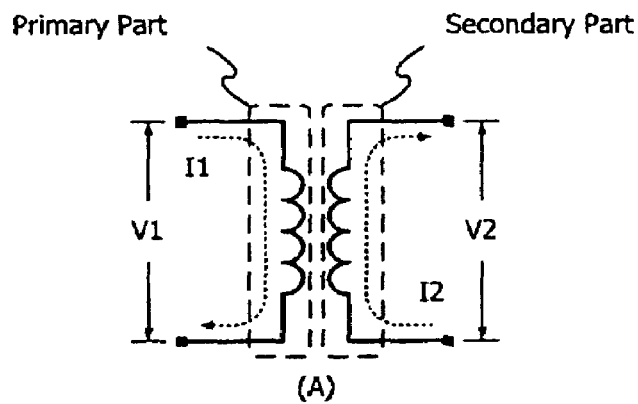
FIG. 13 is a circuit diagram showing the power amplifier shown in FIG. 6 in which a transmission line transformer configuring the power combiner is replaced with a spiral transformer.
Figure 13:
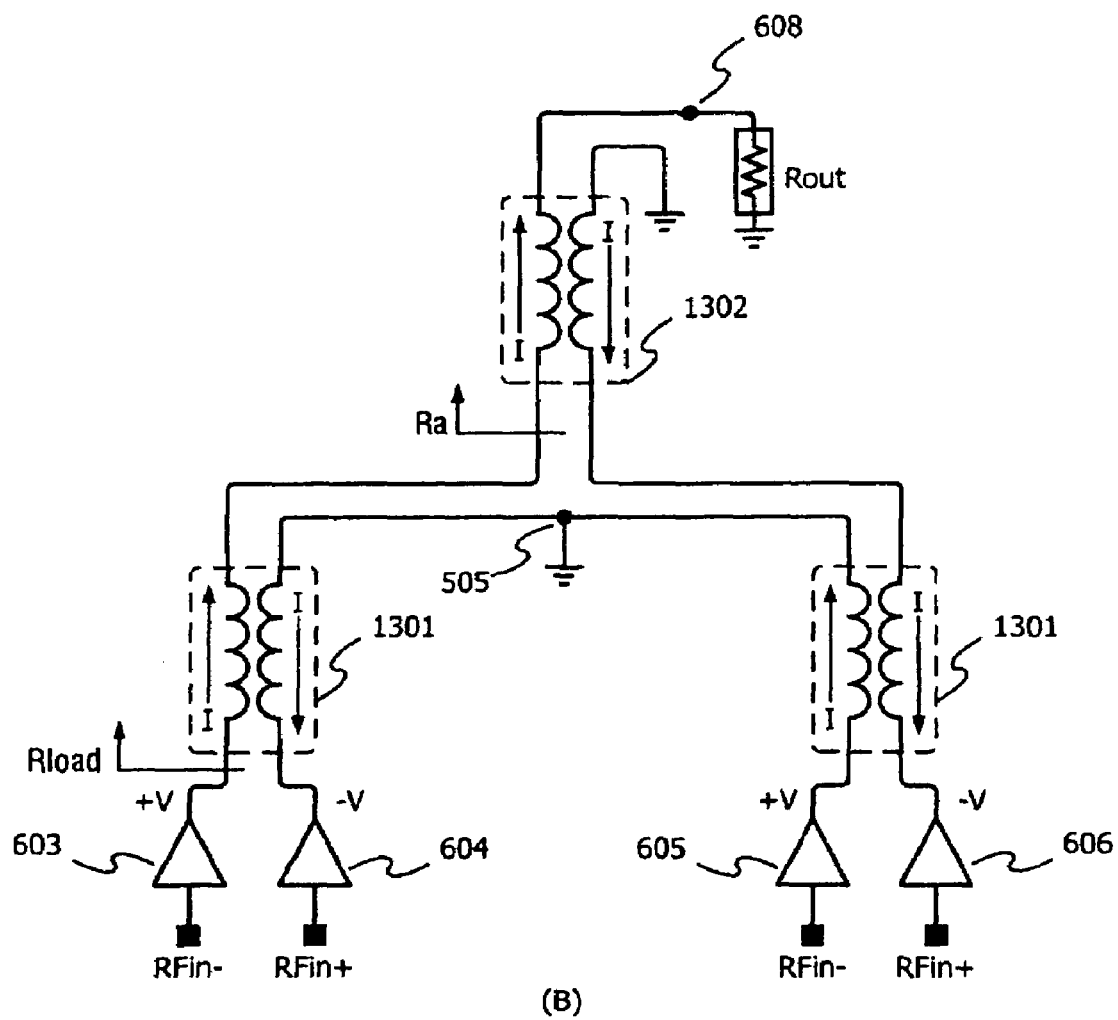

FIG. 13 is a circuit diagram showing the power amplifier shown in FIG. 6 in which a transmission line transformer configuring the power combiner is replaced with a spiral transformer.

Since the basic operation principles of the transmission line transformer and the general spiral transformer are equal, the transmission line transformer may be replaced with the spiral transformer in the power combiner according to the present invention using the transmission line transformer.

That is, if the turn ratio of the spiral transformers 1301 and 1302 shown in FIG. 13B is 1:1, the spiral transformers have the same characteristics as the power combiner using the transmission line transformer and the computation of the values N and R is performed as described above. However, if the turn ratio of the spiral transformers is 1:N or N:1 instead of 1:1, the levels of the current and the voltage of the primary part or the secondary part of each spiral transformer can be analyzed by the computation of a current ratio and a voltage ratio of the primary part and the secondary part according to the turn ratio of the spiral transformer expressed by Equation 7. Thus, the value of the resistor Rload according to the value Rout can be computed.

Accordingly, even when the spiral transformer is used, the values N and R can be easily obtained using the above-described method.

$$N = \frac{V2}{V1} = \frac{I1}{I2}\qquad\text{Equation 7}$$

N: turn ratio of the spiral transformer

V1: difference in voltage between two ports of the primary part of the transformer I1: level of current flowing in the primary part of the transformer V2: difference in voltage between two ports of the secondary part of the transformer I2: level of current flowing in the secondary part of the transformer According to the present invention, it is possible to minimize power loss and to improve efficiency of a power amplifier with a large output power, by combining powers generated by a plurality of power amplifiers used in a wireless communication system using a transmission line transformer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A power amplifier using a power combiner, wherein first and second amplifier units amplify and output radio frequency signals having opposite phases and are respectively connected to one ends of a first transmission line and a second transmission line of a first transmission line transformer, third and fourth amplifier units amplify and output radio frequency signals having opposite phases and are respectively connected to one ends of a third transmission line and a fourth transmission line of a second transmission line transformer, the other ends of the second transmission line of the first transmission line transformer and the third transmission line of the second transmission line transformer are connected to each other so as to be connected to ground, the other end of the first transmission line of the first transmission line transformer is connected to one end of a fifth transmission line of a third transmission line transformer, the other end of the fourth transmission line of the second transmission line transformer is connected to one end of a sixth transmission line of the third transmission line transformer, the fifth transmission line of the third transmission line transformer is connected to ground via an output resistor, and the sixth transmission line of the third transmission line transformer is connected to ground.

2. The power amplifier according to claim 1, wherein the power amplifier is combined in plural and the third transmission line transformers of the power amplifiers are commonly connected to the output resistor and ground.

3. A power amplifier using a power combiner, wherein:

first and second amplifier units amplify and output radio frequency signals having opposite phases and are respectively connected to one ends of a first primary part and a first secondary part of a first spiral transformer;

third and fourth amplifier units amplify and output radio frequency signals having opposite phases and are respectively connected to one ends of a second primary part and a second secondary part of a second spiral transformer;

the other ends of the first secondary part of the first spiral transformer and the second primary part of the second spiral transformer are connected to each other so as to be connected to ground;

the other end of the first primary part of the first spiral transformer is connected to one end of a third primary part of a third spiral transformer;

the other end of the second secondary part of the second spiral transformer is connected to one end of a third secondary part of the third spiral transformer;

the third primary part of the third spiral transformer is connected to ground via an output resistor; and the third secondary part of the third spiral transformer is connected to ground.

4. The power amplifier according to claim 1, wherein the power amplifier is combined in plural, a fourth transmission line transformer is interposed between the output resistor and ground, different outputs of the third transmission line transformers of the power amplifiers are connected to each other, and the other different outputs of the third transmission line transformers are respectively connected to a seventh transmission line and an eighth transmission line of the fourth transmission line transformer.

5. A power amplifier using a power combiner, wherein:

first and second amplifier units amplify and output radio frequency signals having opposite phases and are respectively connected to one ends of a first primary part and a first secondary part of a first spiral transformer;

third and fourth amplifier units amplify and output radio frequency signals having opposite phases and are respectively connected to one ends of a second primary part and a second secondary part of a second spiral transformer;

the other ends of the first secondary part of the first spiral transformer and the second primary part of the second spiral transformer are connected to each other so as to be connected to ground;

the other end of the first primary part of the first spiral transformer is connected to one end of a third primary part of a third spiral transformer;

the other end of the second secondary part of the second spiral transformer is connected to one end of a third secondary part of the third spiral transformer;

the third primary part of the third spiral transformer is connected to ground via an output resistor; and the third secondary part of the third spiral transformer is connected to ground, wherein:

the power amplifier is combined in plural, a fourth spiral transformer is interposed between the output resistor and ground, different outputs of the third spiral transformers of the power amplifiers are connected to each other, and the other different outputs of the third spiral transformers are respectively connected to a fourth primary part and a fourth secondary part of the fourth spiral transformer.

6. A power amplifier using a power combiner, wherein first and second amplifier units amplify and output radio frequency signals having opposite phases, the first amplifier unit is connected to one ends of first and third transmission lines of first and second transmission line transformers, the second amplifier unit is connected to one ends of second and fourth transmission lines of the first and second transmission line transformers;

the other end of the second transmission line of the first transmission line transformer and the other end of the third transmission line of the second transmission line transformer are connected to each other so as to be connected to ground, the other end of the first transmission line of the first transmission line transformer is connected to one end of a fifth transmission line of a third transmission line transformer, the other end of the fourth transmission line of the second transmission line transformer is connected to one side of a sixth transmission line of the third transmission line transformer, the fifth transmission line of the third transmission line transformer is connected to ground via an output resistor, and the sixth transmission line of the third transmission line transformer is connected to ground.

7. The power amplifier according to claim 1, wherein the power amplifier is combined in plural, and the third transmission line transformers of the power amplifiers are commonly connected to the output resistor and ground.

8. A power amplifier using a power combiner, wherein:

first and second amplifier units amplify and output radio frequency signals having opposite phases, the first amplifier unit is connected to one ends of a first primary part and a second primary part of a first and second spiral transformers;

the second amplifier unit is connected to one ends of a first secondary part and a second secondary part of the first and second spiral transformers;

the other end of the first secondary part of the first spiral transformer and the other end of the second primary part of the second spiral transformer are connected to each other so as to be connected to ground;

the other end of the first primary part of the first spiral transformer is connected to one end of a third primary of a third spiral transformer;

the other end of the second secondary part of the second spiral transformer is connected to one side of a third secondary part of the third spiral transformer;

the third primary part of the third spiral transformer is connected to ground via an output resistor; and the third secondary part of the third spiral transformer is connected to ground, wherein:

the power amplifier is combined in plural, and the third spiral transformers of the power amplifiers are commonly connected to the output resistor and ground.

9. The power amplifier according to claim 1, wherein the power amplifier is combined in plural, a fourth transmission line transformer is interposed between the output resistor and ground, different outputs of the third transmission line transformers of the power amplifiers are connected to each other, and the other different outputs of the third transmission line transformers are respectively connected to a seventh transmission line and an eighth transmission line of the fourth transmission line transformer.

10. A power amplifier using a power combiner, wherein:

first and second amplifier units amplify and output radio frequency signals having opposite phases and are respectively connected to one ends of a first primary part and a first secondary part of a first spiral transformer;

third and fourth amplifier units amplify and output radio frequency signals having opposite phases and are respectively connected to one ends of a second primary part and a second secondary part of a second spiral transformer;

the other ends of the first secondary part of the first spiral transformer and the second primary part of the second spiral transformer are connected to each other so as to be connected to ground;

the other end of the first primary part of the first spiral transformer is connected to one end of a third primary part of a third spiral transformer;

the other end of the second secondary part of the second spiral transformer is connected to one end of a third secondary part of the third spiral transformer;

the third primary part of the third spiral transformer is connected to ground via an output resistor; and the third secondary part of the third spiral transformer is connected to ground, wherein:

the power amplifier is combined in plural, a fourth spiral transformer is interposed between the output resistor and ground, different outputs of the third spiral transformers of the power amplifiers are connected to each other, and the other different outputs of the third spiral transformers are respectively connected to a forth primary part and forth secondary part of the fourth spiral transformer.

11. A power amplifier using a power combiner, wherein:

first and second amplifier units amplify and output radio frequency signals having opposite phases and are respectively connected to one ends of a first primary part and a first secondary part of a first spiral transformer;

third and fourth amplifier units amplify and output radio frequency signals having opposite phases and are respectively connected to one ends of a second primary part and a second secondary part of a second spiral transformer;

the other ends of the first secondary part of the first spiral transformer and the second primary part of the second spiral transformer are connected to each other so as to be connected to ground;

the other end of the first primary part of the first spiral transformer is connected to one end of a third primary part of a third spiral transformer;

the other end of the second secondary part of the second spiral transformer is connected to one end of a third secondary part of the third spiral transformer;

the third primary part of the third spiral transformer is connected to ground via an output resistor; and the third secondary part of the third spiral transformer is connected to ground, wherein the power amplifier is combined in plural and the third spiral transformers of the power amplifiers are commonly connected to the output resistor and ground.

12. A power amplifier using a power combiner, wherein:

first and second amplifier units amplify and output radio frequency signals having opposite phases and are respectively connected to one ends of a first primary part and a first secondary part of a first spiral transformer;

third and fourth amplifier units amplify and output radio frequency signals having opposite phases and are respectively connected to one ends of a second primary part and a second secondary part of a second spiral transformer;

the other ends of the first secondary part of the first spiral transformer and the second primary part of the second spiral transformer are connected to each other so as to be connected to ground;

the other end of the first primary part of the first spiral transformer is connected to one end of a third primary part of a third spiral transformer;

the other end of the second secondary part of the second spiral transformer is connected to one end of a third secondary part of the third spiral transformer;

the third primary part of the third spiral transformer is connected to ground via an output resistor; and the third secondary part of the third spiral transformer is connected to ground, wherein:

the power amplifier is combined in plural, and the third spiral transformers of the power amplifiers are commonly connected to the output resistor and ground.

* * * * *